United States Patent [19]

Myhre et al.

[11] Patent Number: 4,786,188

[45] Date of Patent: Nov. 22, 1988

[54] PURGE AIR SYSTEM FOR A COMBUSTION INSTRUMENT

[75] Inventors: Douglas C. Myhre, Eden Prairie; David Y. H. Pui, Plymouth; Larry V. Miller, Burnsville, all of Minn.

[73] Assignee: Rosemont Inc., Eden Prairie, Minn.

[21] Appl. No.: 833,976

[22] Filed: Feb. 27, 1986

[51] Int. Cl.⁴ .............................. G01J 5/02; G01J 5/10
[52] U.S. Cl. ..................... 374/125; 350/584; 356/43; 374/144
[58] Field of Search ............... 374/125, 144; 350/584; 356/43

[56] References Cited

U.S. PATENT DOCUMENTS

| | | | |
|---|---|---|---|
| 3,436,965 | 4/1969 | Land | 374/125 X |
| 3,626,758 | 12/1971 | Stewart et al. | 374/131 X |
| 3,846,080 | 11/1974 | MacLean et al. | 374/125 X |
| 3,861,198 | 1/1975 | Shea | 350/584 X |
| 3,877,780 | 4/1975 | Taylor | 350/584 |
| 4,018,513 | 4/1977 | Boeke | 350/584 X |
| 4,037,473 | 7/1977 | Compton et al. | 374/125 |
| 4,118,985 | 10/1978 | Compton | 374/125 |
| 4,306,835 | 12/1981 | Hurley | 350/584 X |
| 4,435,093 | 3/1984 | Krause et al. | 374/129 |
| 4,459,043 | 7/1984 | Luke | 374/144 x |

FOREIGN PATENT DOCUMENTS

| | | |
|---|---|---|
| 7728335 | 9/1977 | France . |
| 584195 | 1/1978 | U.S.S.R. . |
| 1559185 | 2/1978 | United Kingdom . |
| 2130717 | 2/1983 | United Kingdom . |

Primary Examiner—D. M. Yasich
Attorney, Agent, or Firm—Kinney & Lange

[57] ABSTRACT

A radiation instrument has a purging air flow system for passing air over the lens to keep it clean and free from particulate contaminants and also for providing a positive flow of air away from the lens. The air supply used for such purging is controlled adequately so the flow changes direction and particles are removed from the main flow of purge air by inertial separation prior to the time the air contacts the lens. Such air entrained particles might otherwise deposit on the lens. A flow control orifice provides a secondary flow to carry the particles separated from the main flow out of the flow passageway.

16 Claims, 2 Drawing Sheets

PURGE AIR SYSTEM FOR A COMBUSTION INSTRUMENT

BACKGROUND OF THE INVENTION

1. Field of the Invention

The present invention relates to systems for purging contaminants from the lens of a combustion instrument such as a radiation pyrometer.

2. Description of the Prior Art

Radiation pyrometers are widely used for detecting temperatures in applications such as gas turbines, and the standard pyrometers sense radiation through a lens that is normally mounted in a tube that opens through a housing into a turbine rotor chamber. Accurate determination of turbine blade temperature is necessary in order to enable the engine to be operated at optimal thrust and efficiency, without heating the blades to a point where they warp or lose structural strength. Pyrometry is used extensively as a development tool on research turbines, and is an accepted inflight control/monitor for military aircraft engines. One of the requirements is that the pyrometer lens be kept clean and free of particulate contaminants. Particles deposited on the lens will reduce the energy to the sensor and thereby cause inaccurate temperature measurements. Several purge air designs have been developed to keep particulate contaminants from the lens and the sighting tube, but most have certain limitations in all normal instances, for example when the pyrometers are to be mounted with the sighting tube facing in an upward direction. Gravity will cause particles to fall down onto the lens. In some designs, a particle laden compressor air supply is used to "scrub" the surface of the lens, that is, pass over the surface of the lens. Significant particle deposition on the lens occurs as the result of the contaminants from the purge air flow contacting and adhering to the lens as the air passes over the surface.

Other designs provide an air curtain spaced from the lens that is intended to keep the flow of air in a direction to move the particles away from the lens, but during starting and stopping of the turbine in an aircraft, for example particularly when the pyrometer lens surface is facing upwardly, particles precipitate and accumulate on the lens surface.

A known, simplified, purge air system for a fiber optic cable system is shown in British Patent Specification No. 1,559,185 issued to Smiths Industries Limited. Outward air flow is provided in a housing surrounding the cable end. Air flow in a single passageway past the lens and out into the turbine chamber. Particles in the air are carried across the lens in that no provision is made for removal of such particles.

British Specification No. 2,130,717, owned by Smiths Industries Public Limited Company, shows a more sophisticated purge air system for a pyrometer wherein air flows through a tubular member surrounding the pyrometer lens, which opens directly into a large diameter sight tube, again giving no removal or at best inefficient removal of particles from the air prior to passage of the air over the lens and also provides flow patterns which make it difficult to remove particles which have deposited on the lens.

U.S. Pat. Nos. 4,037,473 and 4,118,985 are based on the same parent application, and show radiation pyrometers that have a purging fluid which is a plenum chamber and provides a purge air flow around the sensing heads but without inertial separation particles from the purge air and the air is not directed across the ends of the sensing heads.

French Pat. No. 77-28335 shows a purge air system substantially similar to that shown in British Specification No. 1,558,185 and used in a radiation pyrometer for turbine blade temperature sensing.

U.S. Pat. No. 4,435,093 shows a pyrometer having a flow of purge air over a lens system, and through diverging passageways illustrated in FIG. 3 of this patent at 40, 41 and 42. The purge air flows through the passageways at least in part across the lens and goes into a large diameter sight tube where it will flow outwardly. The purge air is not subjected to inertial separation of particles before it passes over the lens.

U.S. Pat. No. 4,306,835 shows an air purging unit for an optical pyrometer used in a gas turbine engine that provides angled ports or nozzles spaced downstream from the pyrometer lens, to form a type of a "air curtain" intended to prevent the particles from striking the lens. The problems with ground stops and the like discussed above are present in this device.

U.S. Pat. No. 3,436,965 also shows a purging system for radiation pyrometers, and in this device, it is intended that the air velocity of the purging air would increase as it exits from the sight tube, but, again, the air is to form a curtain that is spaced from the lens in direction toward the sighting opening, and problems that occur when the air velocity is reduced, particularly when the tube is facing upwardly, are present.

Russian Pat. No. 584195 shows a type of shielding device for a pyrometer lens, but without the inertial separation feature of the present invention.

SUMMARY OF THE INVENTION

The present invention relates to a purging system for passing a flow of fluid over a window of a combustion instrument to keep it clean and free from particulate contaminants which affect the radiation transmissive characteristics of the window, by insuring that the fluid supply used for such purging is controlled adequately to first remove particles from the purge air which might otherwise affect the lens prior to the time the air or fluid is passed over the lens. The purge air also is controlled to maintain an adequate flow velocity to insure that particles that are removed from the lens remain entrained and are carried outwardly away from the pyrometer lens.

At the present time in gas turbines the accurate determination of turbine blade temperature utilizes pyrometry extensively, and in most instances the pyrometer is spaced from the turbine blades and senses radiation through a tube or passageway open to the turbine rotor and rotor chamber. The turbine blades pass in front of the sight tube or passageway as the rotor rotates. Positive pressure flow through the sight tube, besides removing particles from the lens, maintains a positive pressure to prevent turbine combustion gases with suspended combustion particles from entering the sight tube and contaminating the lens. In the present invention, compressor air is used for purging and at least the heavier particles carried by the compressor air supply are separated out by causing a change in direction of airflow immediately prior to its passage over the lens. Thus, the present system does not worsen the situation by passing particle laden compressor air over the lens. The separation eliminates that source of contamination that is present, usually during ground engine operations, when ambient air (used in the compressor) will be carrying dust particles and other particles.

The pyrometer sighting tubes are many times oriented substantially vertical with an upward facing opening in installations such as aircraft turbines, and thus the sighting tube form s a small "well" into which particles acted on by gravity can drop when the turbine is not operating. Such particles then would fall on the lens. Thus, a positive air flow aids in avoiding gravity deposition as well, and placing the sight tube at an angle with respect to the vertical is also beneficial.

When small particles such as particles formed of an organic material with an adhesive surface are deposited on a pyrometer lens surface they will tend to be firmly attached to the lens by adhesion forces between the particles and the lens. The present device provides for a flow that can be controlled so that an adequate air velocity will be passed across the lens to reentrain deposited particles. Many factors are involved in the adhesion forces, and whether or not a particle will adhere to the lens, depends on particle size, particle bounce or rebound energy, and the surface properties of a particle and a lens. The air velocity in the sight tube that is provided by the purging system also will affect the adherence of the particles.

It has been found that particulate contaminants sources include atmospheric as well as compressor produced particles that might be generated by compressor rotation or might be ingested by the compressor. Mechanically abraided particles and some submicron oil mists are present in the compressor flow. It has been found that coarser or larger particles from the compressor may consist of molten solid material (for example molten aluminum) which is not easily removed once it is fused to a pyrometer lens, and thus control of coarse particles is important in a purge system.

The present invention serves to insure that the purge air that is used has gone through an inertial separation step so larger particles such as molten solid particles that may fuse the lens upon contact are separated prior to passing over the lens. It has been found that it is very difficult to reentrain submicron particles, but larger particles or course particles such as molten solid particles that fuse on the lens upon contact are the most likely to be deposited, and they may not be burned off at high temperature, so removal of such particles from the purge air greatly aids in keeping the lens free from such deposits.

The present system provides a simple mechanically expedient arrangement for not only controlling the amount of flow of compressor air past the pyrometer lens to purge the lens and reentrain particles that may have been deposited as well as maintaining a positive pressure in the sight tube, but also includes means for causing the air to change direction significantly just prior to passage over the lens, for inertial separation of larger particles, which cause the most acute problem on the lens, from the purge air.

DETAILED DESCRIPTION OF THE PREFERRED EMBODIMENTS

Figure 1:
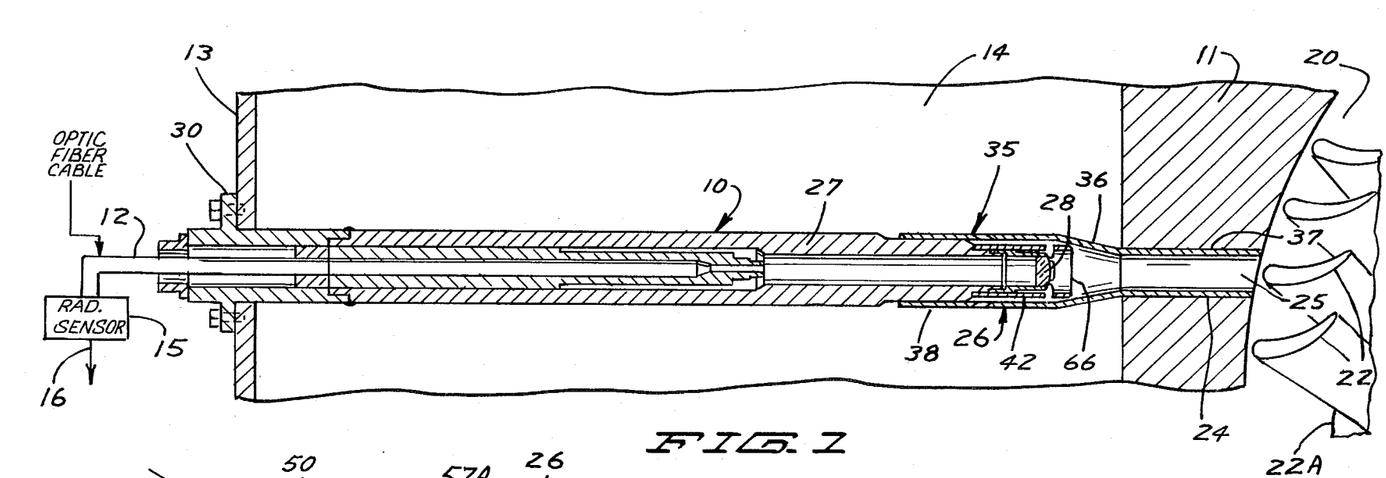
FIG. 1 is a fragmentary vertical sectional view through a portion of a typical turbine compressor, and showing a sectional view of radiation pyrometer having a purge system made according to the present invention installed thereon.

A typical radiation pyrometer indicated generally at 10 is adapted to be mounted in a gas turbine including a turbine housing 11, and an outer shell or wall 13, which together define a compressor bypass passageway indicated at 14 that receives air under pressure from the inlet compressor (before combustion) and is filled, therefore, with air at a pressure above atmospheric pressure, and above that of a combustion suspension which is within the turbine chamber indicated generally at 20 on the interior of the housing or case 11.

Turbine blades schematically indicated at 22 are mounted on a suitable rotor 22A, and the temperature of the turbine blades 22 is to be measured by the pyrometer 10 in order to insure that the design operating temperatures are not exceeded, but yet to permit the turbine to operate at or near its most efficient operating temperature.

The case 11 has a port indicated generally at 25 opening to a passageway 24 in the case 11 which houses a sight tube assembly 26. The sight tube assemlby 26 is made to support the pyrometer barrel 27 in a suitable location, so that the pyrometer lens indicated at 28 is positioned axially centered on the axis of the sight tube assembly 26 and in position to receive radiation from the turbine blades 22 through the port 25. Sight tube assembly 26 fits slidingly in passageway 24 to allow for movement due to thermal expansion and contraction between case 11 and wall 13.

The opposite end of the pyrometer 10 has a flange 30 that is mounted to wall 13 in a desired manner. The pyrometer 10 includes optical fiber cable 12 which receives radiation from the turbine blades 22 which passes through the lens 28. The optical fiber cable 12 is of conventional design and conveys the radiation to radiation sensing means 15, which senses the radiation conventionally, such as with silicon photodiodes and optical filters, and produces an output 16 indicative of the temperature of the turbine blades. The diameters of the window or lens 28 and tube 37 are determined by the requirements of the optical fiber cable 12 and the spacing between the end of the cable and the turbine blade in a conventional manner.

The problems that have been outlined in relation to the depositing of materials on the pyrometer lens are present in most pyrometer systems where a lens or radiation transparent window is open through an open port into a turbine chamber. Any deposits on the lens or window degrades the pyrometer performance and attenuates the radiation signals being received, and thus makes the temperature indications less reliable. In the first form of the invention shown in FIGS. 1, 2 and 3, it can be seen that in order to supply purge air, a series of passageways are provided for permitting air from the chamber 14, which is under pressure, to pass across or purge the lens of particulate contaminants. The sight tube assembly 26 includes an outer conduit or tube member 35 that has a tapered transition section 36 extending from a barrel portion 37 (which fits into passageway 24) to a pyrometer receiving sleeve 38 of larger diameter than the barrel 37. The tube 35 defines an annular passageway indicated at 39 between the interior of the sleeve 38 and a second smaller sleeve 42, which is concentric with the sight tube assembly 26 and fits around an annular surface 43 of the pyrometer barrel 27. Sleeve 42 is fixed in place and forms a flow control sleeve for controlling and directing purge air flow. The lens 28 of the pyrometer is of an ordinary design, and it closely fits within the interior of the sleeve 42. The structure of pyrometer 10 including the sight tube assembly 26 concentric about sleeve 42 provides a rugged, vibration-resistant passageway for purge air flow.

Figure 2:
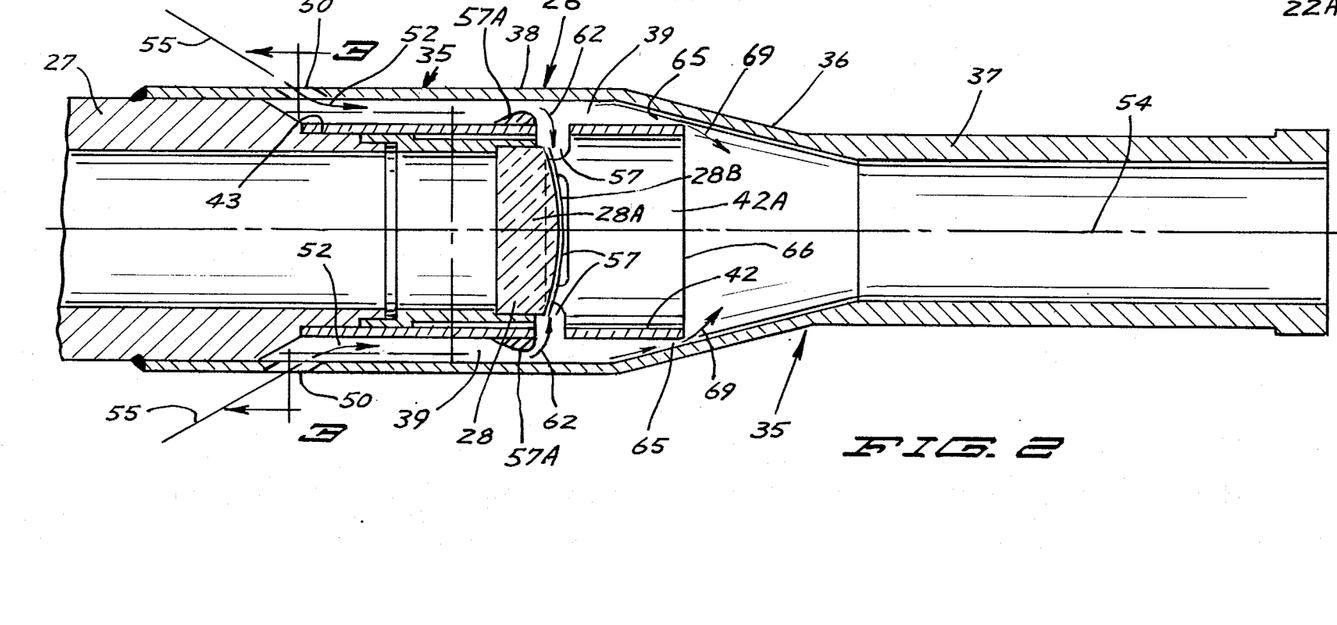
FIG. 2 is an enlarged vertical sectional view of the sight tube portion and pyrometer lens of the device shown in FIG. 1.
Figures 3, 4, 5:
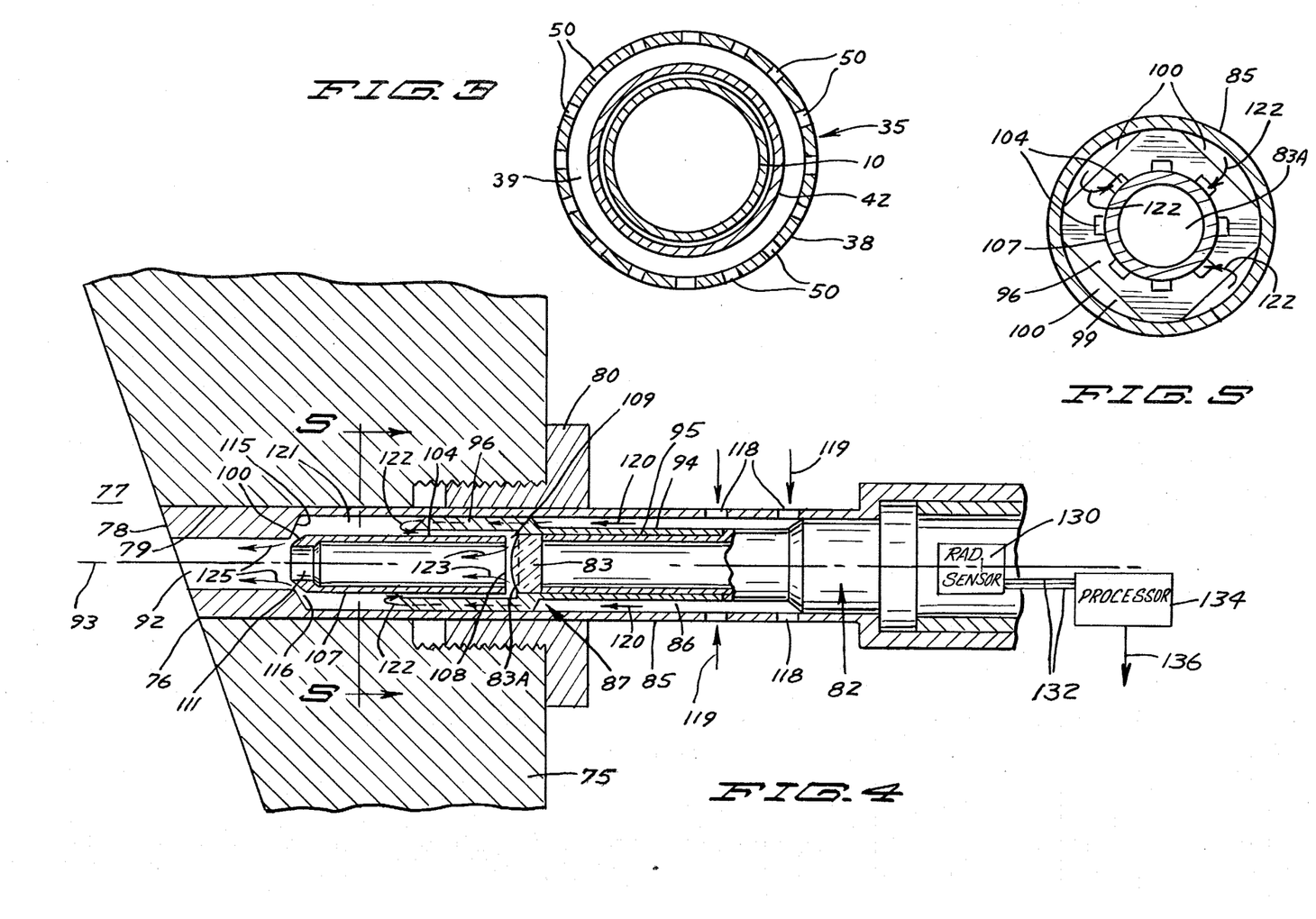
FIG. 3 is a sectional view taken generally along line 3—3 in FIG. 2.
FIG. 4 is an enlarged vertical sectional view of a modified form of the invention.
FIG. 5 is a sectional view taken on line 5—5 in FIG. 4.

The passageway 39 is an annular passageway, as shown in FIG. 3. A plurality of air inlet openings indicated at 50 are provided in the sleeve 38 of the tube 35. These openings 50 are spaced around the periphery to carry pressurized compressor air present in the chamber 14 into the passageway 39. As seen in FIG. 2, the openings 50 have axes 55 that are included relative to the longitudinal axis 54 of the sight tube assembly 26 to minimize direction change and turbulence as the air enters passageway 39. Particles present in the compressor air entering openings 50 may be found to impact on an outer surface of sleeve 42. Some of these particles may be deflected off the outer surface of sleeve 42 and carried with the purge air flow along passageway 39. Other particles, such as small particles formed or organic material having surfaces with adhesive properties may adhere to the outer surface of sleeve 42. The particles adhered to the outer surface of sleeve 42 may adhere together and agglomerate into a larger particle which is later scrubbed off by the purge air flow and carried by the purge air flow along passageway 39. The compressor pressure at openings 50 is greater than that in the turbine chamber 20, and thus there will be flow in passageway 39 as indicated by the arrows 52 parallel to the longitudinal axis 54. The flow control sleeve 42 has a plurality of openings 57 (as shown in FIG. 2) through the wall thereof that are in transverse alignment with the surface 28A of the lens 28. The openings 57 are large and cause air in passageway 39 to flow into the interior passageway 42A of sleeve 42 and out to the interior of tube 26 forming a passageway for flow to port 25.

The abrupt change in direction of air flow, as it enters the internal passageway 42A of sleeve 42 through openings 57, as indicated by the arrows 62 causes inertial particle separation. The heavier particles, such as those larger than a few microns, suspended in the air flowing in passageway 39 will tend to be separated out of the air flow before the flow enters the interior 42A of the sleeve 42. The flow through openings 57 moves past lens 28 and in particular across the lens surface 28A. The smaller particles, such as particles smaller than a few microns, that move past the lens 28 tend to remain entrained in the air flow and are not effectively deposited on the lens. The smaller particles have insufficient momentum to penetrate a boundary layer 28B of purge air formed at the lens surface 28A.

The outer surface of sleeve 42 may be cylindrical along its length as shown in FIG. 1, but inertial particle separation and the flow through openings 57 may be further enhanced by shaping the outer surface of sleeve 42 with a shaped annular surface 57A as shown in FIG. 2. Optional shaped surface 57A has an airfoil shape which provides a desired reaction force in the moving purge air which induces a large flow through openings 57.

As the air flow represented in FIG. 2 by the arrows 62 flows across the surface 28A of the lens 28 (or radiation window), it will tend to scrub the surface 28A with relatively clean air because the larger particles (such as molten metal particles, dirt, etc.) will be separated out by inertial separation caused by the sharp turn in direction of air flow at openings 57. This flow across the lens will also tend to reentrain particles that have been deposited on the lens. The positive flow will keep particles that are within the interior chamber 42A of sleeve 42 moving and will carry the particles out through the internal passageway in direction along the axis 54 toward the port 25. The sleeve 42 forms part of the flow conduit for air flow from the lens 28 to port 25.

The control of flow from openings 50 into openings 57 is achieved by providing an annular flow control orifice indicated generally at 65 formed between the inner surface of the transition portion 36 of the outer end 66 of the sleeve 42. The annular control and restriction orifice 65 causes a minor flow indicated by the arrows 69 from passageway 39 past the end surface 66 of the sleeve 42 into the transition section 36 where the flow will join with the flow represented by the arrows 62 from the interior passageway 42A of the sleeve 42. The size of restriction orifice 65 is set to a desired dimension by placing a removable shim over the end of sleeve 42 and then sliding tube assembly 26 back over pyrometer barrel 27 until the tapered section 36 contacts the skin. The tube assembly 26 is then welded to pyrometer barrel 27 and the shim is removed. The total flow then goes through the center portion of the barrel 37 outwardly into the turbine chamber through the port 25. The minor flow through the flow control orifice will carry particles separated by the inertial action of changing direction of the air as it enters through openings 57 on out through the passageway 39. These particles will be carried through the narrowing end of passageway 39 (where air velocity increases) and into the transition section 36, which also is a constricting section causing greater air velocity. The particles will be carried out and away from the lens 28. The velocity of the purge air flow increases through transition section 36, thus minimizing back flow in transition section 36 and barrel 37 which would otherwise draw suspended combustion particles from turbine chamber 20 into tube assembly 26. The converging section 36 functions an an aerodynamically shaped nozzle which minimizes back flow and contamination of barrel 37 with combustion particles.

The particulate contaminants that are present in the compressor air, such as molten metal particles, oil mist and the like, are separated out before the flow that goes past the lens. The inertial separation to insure that the lens is kept clean and purged adequately in use.

The flow of purge air out of port 25 into turbine chamber 20 forces combustion gases and particles in turbine chamber 20 away from port 25, thus minimizing contamination of lens surface 28A by combustion particles. The flow of purge air through the pyrometer 10 also cools pyrometer 10 to extend the use of the pyrometer in the high temperature environment around case 11.

A modified or second form of the present invention is shown in FIGS. 4 and 5, and incorporates the principle of inertial separation by change of direction of the air as well. As shown in FIG. 4, a turbine housing 75 has a port 76 leading into a rotor chamber 77, and a sight tube assembly 78 is provided in a passageway 79 that opens to the port 76. In this form of the invention, as shown schematically, a gland or nut 80 is used for holding the sight tube assembly 78 in position in the housing 75. The sight tube assembly 78 is adapted so that it will mount a standard radiation pyrometer 82 in position as previously explained. The pyrometer 82 has a lens 83 at its end to receive radiation from turbine blades (not shown) which pass in front of the port 76.

The pyrometer system also includes a radiation sensor 130 which is disposed to receive the radiation entering the pyrometer along axis 93 and passing through lens 83. Radiation sensor 130 is of conventional design and may include photodiodes and optical filters. Leads 132 couple signals from sensor 130 to processor 134 which calculates an output 136 indicative of a temperature in chamber 77.

In this form of the invention, the sight tube assembly includes a tube or barrel 85, which has a first interior annular passageway shown at 86 formed around a flow control guide sleeve assembly 87 which is positioned in conduit or barrel 85. The passageway 86 opens into a smaller diameter passageway 92 that in turn opens into the chamber 77, and the axis of the sleeve, indicated at 93, is parallel to the axis of the passageway 79. The flow control sleeve assembly 87 includes an outer tube 94 that receives an end portion 95 of the pyrometer assembly 82 to hold it centered on the axis 93.

The tube 94 in turn is made with a locating hub 96 that, as shown in FIG. 5, is made to fit within the passageway 86 of the tube 85, but the outer surface of hub 94 is trimmed off with chordal planes or cuts indicated at 99 to provide axial flow passageways 100 along the interior of the passageway 86 toward the outlet passageway 92. As shown in FIG. 5 there are four such passageways 100 defined. The outer surface of the hub portion 96 is used for locating and positioning tube 94 in proper location.

Also, as shown in FIG. 5, the inner surface of the hub portion 96 is provided with a plurality of axially extending slots or passageways indicated at 104. The interior surface of hub 94 is cylindrical and receives and supports a further purge air flow control exhaust tube 107 which is axially aligned and concentric with the axis 93. The flow control tube 107 has an inlet end 108 spaced just downstream from the outer surface 83A of the lens 83. Flow control tube 107 has an interior exhaust passageway, and at its outer end has a tapered outer flow control surface 110. An exhaust port 111, which is of smaller diameter than the rest of the passageway defined by the tube 107 is provided at the outer end of flow control tube 107. The flow control surface 110 cooperates with an annular inwardly extending shoulder 115 formed at the outer end of chamber 121 in barrel 85. The inner edge of shoulder 115 and surface 110 define an annular outlet flow control orifice 116.

The barrel 85 has lateral facing inlet openings 118 at its outer end, and these passageways 118 are open to the compressor bypass chamber of the turbine, so that air under pressure is admitted as indicated by the arrows 119, into the passageway 86. Because the pressure in the compressor bypass chamber in which the openings 118 are located is higher than the pressure in chamber 77, air will flow along the passageway 86 as indicated by arrows 120. This air will flow through the passageways 100 (see FIG. 5) along portions of the hub 96 into the interior chamber 121. Chamber 121 is defined between the flow control tube 107 and the interior of the barrel 85. The annular outlet flow control orifice 116 tends to restrict the flow of air out through this chamber 121 to the outlet passageway 92. Thus the air flowing from passageway 86 through passageways 100 will be caused to flow through the axial passageways 104 toward edge 108 which defines an opening 109 surrounding, and the lens surface 83A. The arrows 122 illustrate the 180 degrees change of direction of flow required as the purge air flows from passageways 100 into passageways 104. This flow moves through opening 109 past the end edge 108 of the tube 107, and causes a flow across the lens surface 83A and then out through the center of the tube 107 as shown by the arrows 123.

The arrow 122 indicates the very sharp turn in direction of flow that is caused by the flow control. This change of direction causes inertial separation of the larger particles, which are in the chamber 121 are carried by the secondary flow out past the tapered surface 110 and through the orifice 116 into the passageway 92, as indicated by the arrows 125. The secondary flow does not abruptly change direction as it enters the passageway 92. The purge air that has scrubbed lens 85A will flow out opening 111 and join the flow coming through orifice 116. The particles that remain entrained will be carried with the airstream into the chamber 77. The lens surface 83A will be purged with air that has been subjected to inertial separation so particles carried by the purge air are removed.

In both forms of the invention, inertial separation of particles from the compressor air flow is achieved by causing an abrupt change in air flow direction of at least substantially 90 degrees to separate out larger particles shortly prior to passage of the air across the pyrometer lens or window. This minimizes potential contamination caused by the purge air and insures that the pyrometer lens will be kept free of particles.

The pyrometer disclosed herein provides a more reliable measure of a turbine blade temperature and thus allows a turbine engine to be operated at a higher power level at which the turbine blade temperature approaches a selected design temperature for the turbine blades.

While the invention has been shown and described for use on a pyrometer, uses on other combustion instruments which make radiation measurements in a contaminated atmosphere such as a combustion suspension will be apparent to those skilled in the art. The purge air system described herein may be used, for example, on a light-off detector which optically senses the presence of flame in a turbine engine or afterburner. The purge air system described herein may also be used on optical sensing systems for sensing the clearance between a turbine rotor tip and a turbine housing, or an optical system for sensing rotor speed. The present invention may also be used in radiation transmission meters for use in power plant smokestacks or diesel engine exhausts.

What is claimed is:

1. An instrument for sensing radiation representative of a parameter in a contaminating suspension and for providing an output indicative of the parameter, the instrument having a housing receiving a supply of presurized fluid having particles therein, comprising:
   port means formed in the housing and opening to the parameter source for receiving the radiation;
   sensing means supported relative to the housing for sensing the received radiation through the port means and for providing the output;

lens means supported relative to the housing between the port means and the sensing means for transmitting the radiation therethrough and for shielding the sensing means from the contaminating suspension, the lens means having a lens surface on an opposite side of the lens means from the sensing means which is exposed to the suspension; and purge means disposed in the housing for maintaining the radiation transmission of the lens means comprising means for establishing a flow path for the pressurized fluid relative to the housing, the means for establishing including means for inertially separating a substantial portion of the particles capable of affecting the radiation transmission from a first portion of the pressurized fluid and for directing such first portion of the pressurized fluid onto the lens surface such that particles from the contaminated suspension are removed from the lens surface by the first portion of the pressurized fluid.

2. An instrument as recited in claim 1 wherein the purge means comprises:

flow diversion means in the means for establishing a flow path for diverting the first portion of the pressurized fluid through a diversion angle of change of fluid flow direction sufficient to inertially separate particles from the diverted first portion, the first portion flowing onto the lens surface subsequent to flowing through the diversion angle.

3. An instrument as recited in claim 2 wherein the means defining a fluid flow path further comprises:

means defining a passageway for the fluid facing the port and extending a selected distance between the port and the lens.

4. An instrument as recited in claim 3 wherein the purge means further comprises:

orifice means disposed between the flow diversion means and the passageway for controlling flow of second portion of the fluid.

5. An instrument as recited in claim 3 wherein the passageway reduces in cross-sectional area in a direction toward the port means at a location between the window means and the port means for reducing back flow of the contaminating suspension in the passageway.

6. An instrument as recited in claim 2 wherein the flow diversion means diverts the first portion of the fluid onto the lens surface to form a boundary layer of fluid at the lens surface, said boundary layer resisting particle deposition on the lens surface.

7. An instrument as recited in claim 2 wherein the diversion angle is substantially 180 degrees.

8. An instrument as recited in claim 2 wherein the instrument is a radiation pyrometer and the parameter is a temperature.

9. An instrument as recited in claim 8 wherein the pressureized fluid is air.

10. An instrument as recited in claim 9 wherein the pressure of the pressurized fluid supply is greater than a pressure of the contaminating suspension at the port, thereby inducing a flow of the pressurized fluid through a portion of the instrument.

11. An instrument as recited in claim 2 wherein the flow diversion includes a member having a surface thereon formed as an airfoil and positioned in the means forming a fluid flow path, the fluid passing over the airfoil, said airfoil forming a portion of the means for diverting the first portion of the fluid.

12. An instrument as recited in claim 2 wherein the diversion angle is at least 90 degrees.

13. An instrument of the type having a housing with a sensing end, comprising a radiation transmitting surface and wherein said end is directed toward and faces a member, the temperature of which is to be detected, including:

a tube surrounding the sensing end of said instrument, and defining a first passage for air flow, said tube having an axis extending beyond said radiation transmitting surface in direction toward the member, the temperature of which is to be sensed;

second means defining a second passageway aligning with the first passageway and within a portion of said tube, and said second means defining, in cooperation with the tube, a third flow passageway surrounding said second means, the second passageway opening to the first passageway and providing a radiation passage from the source of radiation to the radiation transmitting surface; and said second means including a portion providing fluid flow control, including fluid inlet means to said second passageway adjacent said radiation transmitting surface, the fluid inlet means being positioned to cause a change in direction of fluid flowing from said third passageway to said second passageway such that particles are inertially separated from the air flow, flow from the inlet means flowing across said radiation transmitting surface as the flow enters the second passageway, said second means defining a second constricted outlet from said third passageway to the first passageway spaced from said radiation transmitting surface and controlling fluid flow from said third passageway so that a substantial portion of flow in the third passageway goes through the fluid inlet means and across said radiation transmitting surface such that particles are removed from the radiation transmitting surface, but a second portion of such flow in the third passageway goes through the second constricted outlet.

14. The instrument of claim 13 wherein the fluid inlet means includes a fourth passageway open to the third passageway so that fluid flowing from the third passageway to the second passageway changes direction substantially 180 degrees.

15. In an instrument of the type having a housing with a lens, wherein said lens is directed toward and faces a contaminating suspension for detection of temperature of a member, the improvement comprising:

a first tube extending beyond said lens in direction toward a member which is being sensed;

a second tube substantially concentric with said first tube and within said first tube, the second tube being shorter than the first tube, the interior of the second tube and a portion of the first tube forming a first passageway, and the space between an outer surface of the second tube and the inner surface of the first tube forming a second passageway; and said second tube further providing fluid flow control including fluid inlet means leading from said second passageway to said first passageway adjacent said lens positioned to cause a change in direction of fluid flowing from said second passageway to said first passageway and direct such flow across said lens such that particles are removed from the lens surface, and to define a second restricted outlet orifice from said second passageway to the first passageway spaced downstream from said lens in direction toward said source, said second restricted outlet controlling fluid flow from said second passageway so that a substantial portion of the flow in the second passageway flows through the fluid inlet means and across said lens and a second portion of flow goes through the restricted outlet.

16. The instrument of claim 15 and a third tube between the first and second tubes which is shorter than the first and second tubes to separate the second passageway into third and fourth passageway portions, the third tube being at the end of the first passageway adjacent the lens, and the fourth passageway portion being adjacent the second tube, and open to the first passageway, fluid flow being established in the third passageway portion and from the third passageway portion around the end of the third tube to effect substantially a 180 degrees change of direction of fluid flow before such fluid enters the first passageway.

* * * * *

UNITED STATES PATENT AND TRADEMARK OFFICE
CERTIFICATE OF CORRECTION

PATENT NO. : 4,786,188
DATED     : November 22, 1988
INVENTOR(S) : Douglas C. Myhre et al It is certified that error appears in the above-identified patent and that said Letters Patent is hereby corrected as shown below:

On the cover page of the patent, please add as inventor:

-- Inventor: Charles L. Christensen, DePew, New York --.

On the cover page of the patent, please correct the spelling of the name of the assignee to read:

--(73) Assignee: Rosemount Inc., Eden Prairie, MN --.

Col. 3, line 6, delete "form s" and insert --forms--.

Col. 4, line 29, delete "assemlby" and insert --assembly--.

Col. 5, line 27, delete "or" and insert --of--.

Col. 9, line 63, after "diversion" insert --means--.

Signed and Sealed this

Tenth Day of October, 1989

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,786,188

DATED : November 22, 1988

INVENTOR(S) : Douglas C. Myhre ey al

It is certified that error appears in the above-identified patent and that said Letters Patent is hereby corrected as shown below:

Column 2, line 18, delete "a" (second occurrence) and inster --an--.

Column 3, line 43, delete "course" and insert --coarse--.

Column 9, line 56, delete "pressureized" and insert --pressurized--.

Signed and Sealed this

Twenty-second Day of October, 1991

*Attest:*

*Attesting Officer*

HARRY F. MANBECK, JR.

*Commissioner of Patents and Trademarks*